United States Patent [19]
Ahlgren et al.

[11] Patent Number: 5,266,505
[45] Date of Patent: Nov. 30, 1993

[54] IMAGE REVERSAL PROCESS FOR SELF-ALIGNED IMPLANTS IN PLANAR EPITAXIAL-BASE BIPOLAR TRANSISTORS

[75] Inventors: David C. Ahlgren, Wappingers Falls; Shao-Fu S. Chu, Poughkeepsie; Mary J. Saccamango, Patterson; David A. Sunderland, Hopewell Junction; Tze-Chiang Chen, Yorktown Heights, all of N.Y.

[73] Assignee: International Business Machines Corporation, Armonk, N.Y.

[21] Appl. No.: 994,743

[22] Filed: Dec. 22, 1992

[51] Int. Cl.⁵ ............... H01L 21/265; H01L 29/70
[52] U.S. Cl. ..................... 437/31; 148/DIG. 72; 257/515; 257/517
[58] Field of Search ............... 437/31; 148/DIG. 72; 257/510, 513, 514, 515, 517, 518

[56] References Cited

U.S. PATENT DOCUMENTS

| | | | |
|---|---|---|---|
| 4,252,582 | 2/1981 | Anantha et al. | 148/175 |
| 4,309,812 | 1/1982 | Horng et al. | 29/578 |
| 4,347,654 | 9/1982 | Allen et al. | 29/576 B |
| 4,889,831 | 12/1989 | Ishii et al. | 437/31 |
| 4,935,797 | 6/1990 | Jambtkar | 257/197 |
| 5,059,544 | 10/1991 | Burghartz et al. | 437/31 |
| 5,063,167 | 11/1991 | Shimura | 437/31 |
| 5,147,775 | 9/1992 | Ota et al. | 437/31 |
| 5,166,081 | 11/1992 | Inada et al. | 437/31 |
| 5,212,103 | 5/1993 | Shimura | 437/31 |

FOREIGN PATENT DOCUMENTS

| | | | |
|---|---|---|---|
| 478923A | 4/1992 | European Pat. Off. | 437/31 |
| 0073670 | 3/1989 | Japan | 437/31 |
| 0090557 | 4/1989 | Japan | 437/31 |

Primary Examiner—Olik Chaudhuri
Assistant Examiner—Long Pham
Attorney, Agent, or Firm—Whitham & Marhoefer

[57] ABSTRACT

An image reversal process for self-aligned implants in which a mask opening and plug in the opening are used to enable one implant in the mask opening, another self-aligned implant in the region surrounding the opening, and a self-aligned electrode to be formed in the opening.

2 Claims, 3 Drawing Sheets

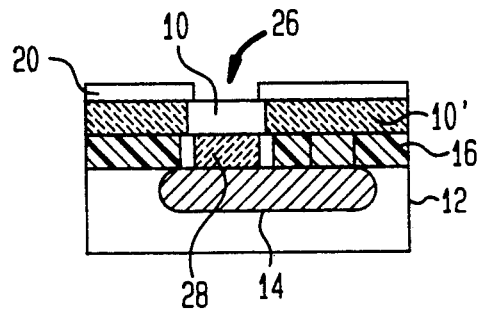
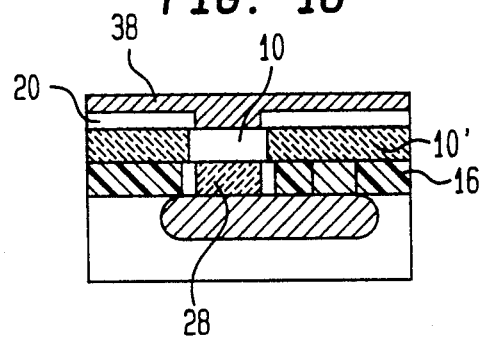
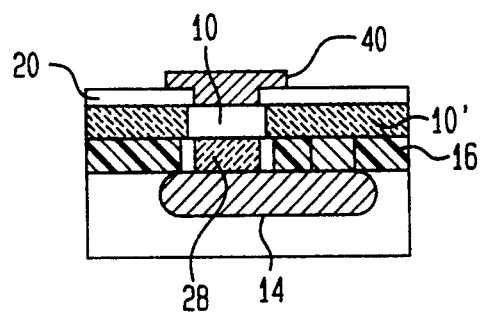

IMAGE REVERSAL PROCESS FOR SELF-ALIGNED IMPLANTS IN PLANAR EPITAXIAL-BASE BIPOLAR TRANSISTORS

BACKGROUND OF THE INVENTION

1. Field of the Invention

This invention relates to an improved method for making self-aligned implants in planar, epitaxial base, bipolar transistors. More particularly, the invention relates to a method for making self-aligned extrinsic base and pedestal collector implants in a planar epitaxial-base bipolar transistor or a heterojunction bipolar transistor.

2. Description of the Prior Art

As will be appreciated by those skilled in the art, in a bipolar transistor, an increase in collector doping in the region directly below the emitter can improve the high frequency performance of the transistor.

In a planar epitaxial-base bipolar transistor, the intrinsic and extrinsic bases are formed in a common layer, and the emitter window represents a region where the emitter polysilicon comes in contact with this base layer. Since it is desirable to have a very thin base layer, the base resistance may be excessive unless the conductivity of the extrinsic base is raised. Although the emitter electrode may be used to mask an extrinsic base implant, there is no convenient way to self-align this extrinsic base implant with the smaller emitter window, or to self-align the emitter window and the extrinsic base with a pedestal collector implant.

A heterojunction bipolar transistor (HBT) resembles an epi-base transistor in that the base is typically a blanket layer, but the emitter layer (which has a wider bandgap than the base) is typically deposited on top of the base in a common epitaxial deposition. Contact to the base layer is usually made by etching through the emitter. Alternatively, in order to form a planar device, an implant can be used to convert a region of the emitter into a thicker extrinsic base. Again, a method for self-aligning this implant to a small emitter window and a pedestal collector implant would be advantageous.

SUMMARY OF THE INVENTION

An object of this invention is the provision of a method for making a self-aligned implants to form a pedestal collector, an extrinsic base, and an emitter contact in a planar, epitaxial base or heterojunction, bipolar transistor. A method which comprises easily implemented process steps and provides a small, but well-controlled separation between the extrinsic base and the pedestal, collector.

Briefly, this invention contemplates the provision of an image reversal process in which a mask opening and plug in the opening are used to enable one implant through the opening, another self-aligned implant in the region surrounding the opening, and a self-aligned electrode to be formed in the opening.

The starting point is an epitaxial structure comprised of a base layer epitaxially grown over the surface of a semiconductor substrate in which shallow isolation trenches have been formed. A stack of insulating films, including a thick top layer and a thin lower layer that selectively can be etched with respect to one another, is then formed over the base epitaxial layer. An emitter window is etched through the stack to expose the surface of the epitaxial base layer, and a collector pedestal region is implanted through this window. Ver little lateral profile straggle occurs during this implant step because the epitaxial base layer through which it is performed is typically quite thin.

A plug is formed in the emitter window opening by filling the opening and then etching away the thick top insulating layer. Sidewalls are formed on the plug and, using the plug as reversed image mask, the extrinsic base layer is implanted. The plug, serving as a reverse image mask ensures that the extrinsic base is closely spaced from the emitter window opening. Finally, the plug is removed and the emitter electrode is formed in the emitter window opening so that it is aligned with the pedestal collector and closely spaced from the extrinsic base.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A through 1K are illustrative sectional view of the structure of a planar epitaxial transistor at various process stages in accordance with one embodiment of a method in accordance with the teachings of this invention.

DETAILED DESCRIPTION OF A PREFERRED EMBODIMENT OF THE INVENTION

Figure 1A:
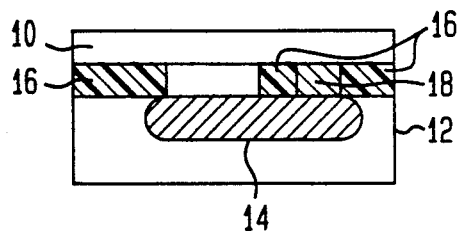

Referring now to FIG. 1A, a process in accordance with the teachings of this invention begins after the structure of FIG. 1A has been formed using process steps well known in the art. Further, while the invention will be described with reference to an NPN planar epitaxial-base transistor, those skilled in the art will appreciate that the teachings are also applicable to PNP transistors, and to heterojunction bipolar transistors. A planar, NPN, epitaxial-base transistor has an P+epitaxial base layer 10 formed on the surface of a semiconductor wafer 12 in which an N+sub-collector region 14 has been formed along shallow isolation trenches 16 and a N+sub-collector reach through 18. In a heterojunction bipolar transistor, it will be appreciated that the epitaxial base layer 10 would have an overlying epitaxial emitter layer.

Figure 1E:
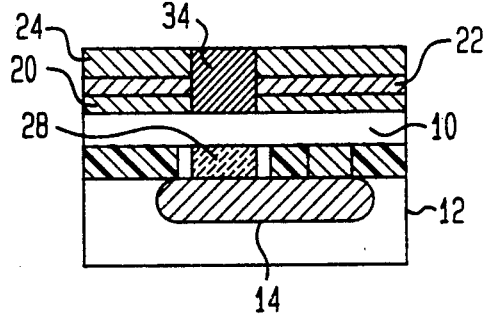
Figure 1B:
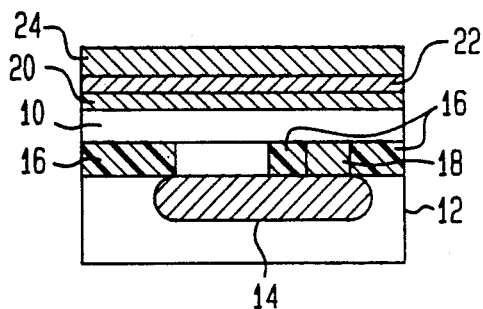

Referring now to FIG. 1B, in accordance with the teachings of this invention, successive insulating layers 20, 22 and 24 are deposited using suitable process steps well known in the semiconductor industry. The first layer 20 (for example, a nitride layer) and the second layer (for example, an oxide layer) are each relatively thin layers on the order of 20 nanometers to 50nanometers thick. The top layer 24 (for example, another nitride layer) is a relatively thick layer on the order of 300 nanometers.

Figure 1F:
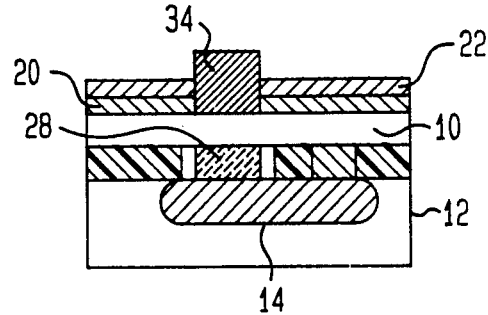
Figure 1C:
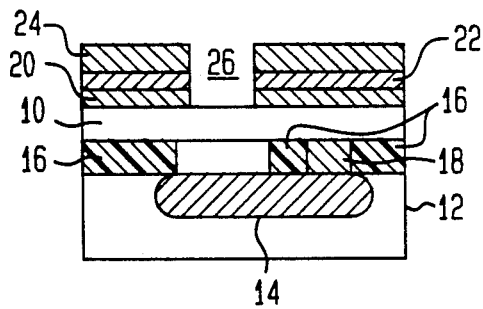

Referring no to FIG. 1C, an emitter window is photolithographically defined on the top surface of the insulator layer 24 and is used to etch an opening 26 extending through layers 24, 22 and 20 to the upper surface of the epitaxial base layer. Preferably, the layers are etched in three steps with each layer being anisotropically etched selectively with respect to the material below it. For example, using RIE the top nitride layer 24 can be $CHF_3/O_2$ etched, the middle oxide layer 22 can be $CHF_3/Ar$ etched and the bottom nitride layer 20

CHF$_3$/O$_2$ etched. The final etch stops when the epitaxial base layer 10 is reached. In this way, the thick top layer 24 can be completely removed in the opening 26 without damaging the surface of the epitaxial layer 10. The structure after the emitter opening 26 has been formed is shown in FIG. 1C.

A pedestal collector implant, for example 200 KeV, is performed through the opening 26 to form an N+pedestal collector 28. There is very little lateral profile straggle during the pedestal collect implant step because the base layer 10 is relatively thin; e.g., 200 nanometers. Here it should be noted that the epitaxial layer 10 in the intrinsic base region 30 located directly above pedestal collector 28 is initially doped so that it is sufficiently P+that it remains P+despite the N+pedestal collector implant step. The structure at this stage is shown in FIG. 1D.

Figure 1G:
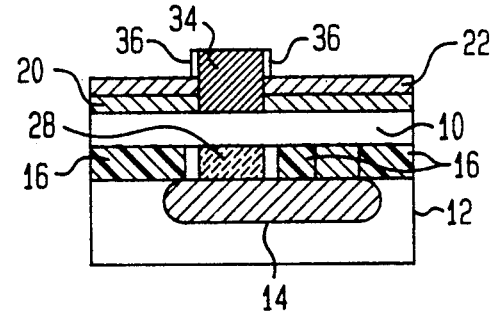
Figure 1D:
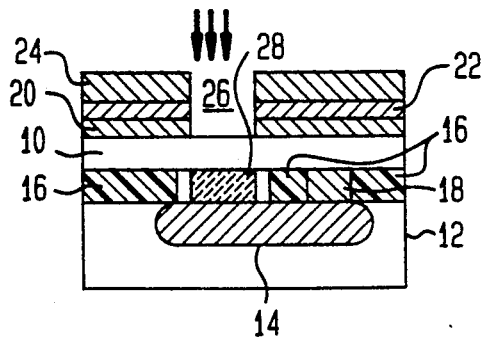

Next, a thick oxide layer (the same material that comprised the intermediate layer 22) is deposited on the surface of the structure shown in FIG. 1D, filling the opening 26. The surface is then planarized so that from this oxide layer only an oxide plug 34 in the opening 26 remains. The planarization technique described in B. Davari, et al., "A New Planarization Technique, Using a Combination of RIE and Chemical Mechanical Polish (CMP)," IEDM Tech. Digest, p. 61, Dec. 1989, can be used for this step. The structure at this stage is shown in FIG. 1E.

The nitride layer 24 is then etched selectively with respect to the oxide plug 34. The structure at this point in the process is shown in FIG. 1F.

A nitride sidewall 36 is then formed on the oxide plug 34 by a suitable process such as nitride deposition CHF$_3$/O$_2$ RIE. The oxide sidewall 36 defines a narrow, but closely controlled gap between the extrinsic base implanted in the next step, the pedestal collector 28 and the emitter contact be formed subsequently. The structure at this stage is shown in FIG. 1G.

Figure 1H:
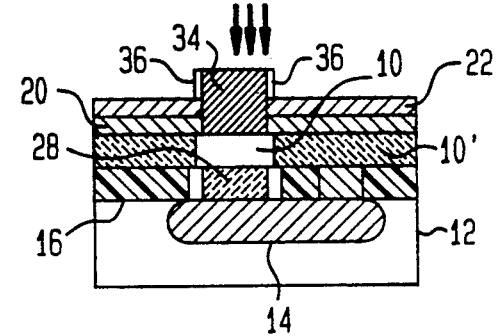

Next, as illustrated in FIG. 1H, the base layer 10 is implanted with a suitable P+dopant, such as 20 KeV Boron, to form an extrinsic base 10' as indicated by the shading of the base layer in FIG. 1H. Here it should be noted that the plug 34 with its sidewalls 36 serve as a reverse image mask forming a narrow, closely controlled gap between the edge of the extrinsic base 10' and both the pedestal collector 28 and the emitter contact that will be subsequently formed in opening 26 that had been formed in layers 20 and 22.

After the intrinsic base implant step, the oxide plug 34 and the nitride sidewalls 36 are removed by first etching the nitride sidewalls with a wet H$_3$PO$_4$ etch and the oxide plug 34 and oxide layer 22 can be thereafter removed by a diluted HF etch step, which does not attack the nitride layer 20. The structure at this stage is shown in FIG. 1I.

An emitter contact is formed by CVD deposition of an polysilicon layer 38 that fills the opening 26, and overlies the nitride layer 20. The structure at this step is shown in FIG. 1J. The emitter contact layer 38 is patterned and etched, using the nitride layer 20 as an etch stop, to form the emitter contact 40 with the emitter window and pedestal collector implant edges coincident and each separated from the extrinsic base implant by the thickness of the plug sidewalls 36. The structure at this final stage before patterning of the extrinsic base and collector contacts, which can be carried out by well-known conventional process steps that will not be described here, is shown in FIG. 1K.

In the process described above, the insulators should be chosen based on the existence of mutual selective etch processes. For consistency with standard silicon processing, the first insulator could be a silicon nitride and the second insulator silicon dioxide, but other material combinations should be possible. It should be noted that additional layers may need to be added to the material stack to enhance etch selectivity. Similarly, the top thick layer may be a different material altogether. The planarization etch should stop within this layer, although an overall reduction in the height of both materials is of no consequence.

FIG. 2 is an alternate embodiment of the current invention, using photoresist material to form the emitter window plug. This approach could be used where topography in other parts of the wafer prevents polishing of the plug down to the level of the surrounding insulator. For this approach, only two of the three insulator layers (20, 22 and 24) shown in FIG. 1A are required.

Figure 2A:
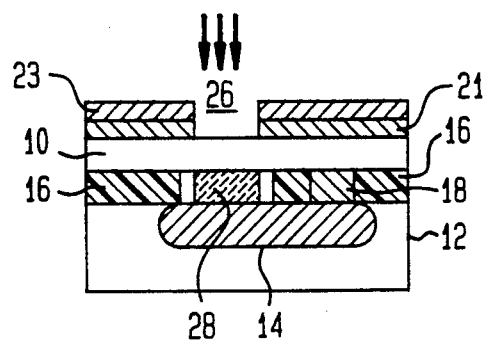
FIGS. 2A through 2D are sectional structure views at various stages, similar to FIG. 1, in accordance with an alternate embodiment of the invention.

FIG. 2A shows the structure after definition of an emitter window opening 26, and the implantation of the pedestal collector 28. The process to this stage is substantially the same as that described in connection with FIG. 1A through 1D and is not repeated here. Here, it should be noted only two insulating layers are used in this embodiment; a lower oxide layer 21 and a upper thicker nitride layer 23.

Figure 2B:
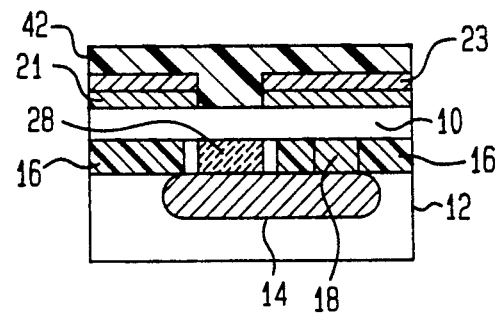
Figure 2C:
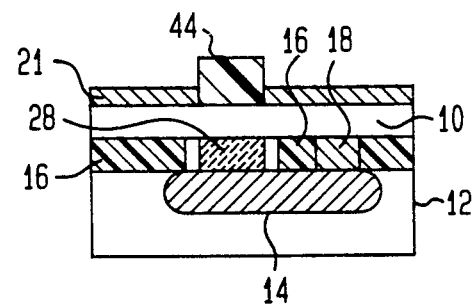

The structure of FIG. 2A is then covered with a layer 42 of a photoresist. Because the photoresist material tends to deposit in a planar fashion, it fills the emitter window opening 26 and is substantially thinner outside the window opening 26, including any surface regions outside the window with a raised local topography. The structure at this stage is shown in FIG. 2B. The wafer is then exposed without a mask to an illumination level that is insufficient to develop the relatively thick photoresist in the emitter window opening 26 yet is sufficient to develop the photoresist layer 42 elsewhere on the surface of the wafer. The developed layer of photoresist is removed and the nitride layer 23 is etched away selectively with respect to the remaining photoresist and the oxide layer 21, leaving a photoresist plug 44 in the opening 26 as shown in FIG. 2C.

Figure 2D:
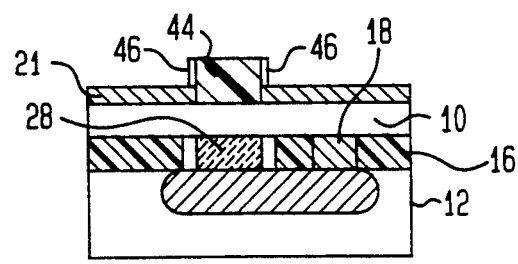

As illustrated in FIG. 2D, sidewalls 46 are formed on the photoresist plug 44. In forming the sidewalls 46, a low temperature deposition (less than 350° C.) process such as plasma CVD oxide or nitride should be used so as not to damage the photoresist plug 44. Alternately, it is possible to create sidewalls from another application of photoresist. In this case, a layer of photoresist is applied which is thinner than the emitter window plug 44 is tall. With the photoresist sufficiently conformal, the photoresist will be thicker at the bottom edges of the plug. A second illumination develops the photoresist where it is thinnest and the developed photoresist can be removed to form a gradually sloping photoresist sidewall. This introduces a corresponding gradient in the extrinsic base doping, creating a natural base link-up region. The remaining steps of extrinsic base implantation and emitter contact formation are substantially the same as those described in connection with FIG. 1. Here, of course, the photoresist plug 44 and its sidewalls can be removed by developing the photoresist and removing the developed photoresist in a conventional process step.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method for making self-aligned implants to form a pedestal collector and an extrinsic base in a semiconductor substrate with an epitaxial base layer formed on an upper surface of said semiconductor substrate, comprising the steps of:

forming a first layer of a first insulator material on the surface of said epitaxial base layer and a second layer of a second insulator material that can be selectively etched with respect to said first layer;

forming an opening in said first layer and said second layer, said opening extending to said epitaxial base layer;

implanting through said opening a dopant to form a pedestal collector region in said semiconductor substrate;

after said implanting step, filling said opening with a masking material with respect to which said second insulator material can be selectively etched;

etching away said second layer so that said masking material forms a plug in the form of said opening;

forming sidewalls on said plug;

implanting a dopant in said epitaxial base layer to form an extrinsic base, using said plug and said sidewalls as a mask to form a gap between pedestal collector region and said extrinsic base.

2. A method for making self-aligned implants to form a pedestal collector and an extrinsic base in a semiconductor substrate as in claim 1, including the further steps of:

removing said plug and said sidewalls from said opening in said second insulator material;

depositing an emitter contact in said opening in said second insulator material.

* * * * *